(12) United States Patent
Nishimoto

(10) Patent No.: US 7,741,139 B2
(45) Date of Patent: Jun. 22, 2010

(54) SOLAR CELL MANUFACTURING METHOD

(75) Inventor: Yoichiro Nishimoto, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 425 days.

(21) Appl. No.: 11/300,539

(22) Filed: Dec. 15, 2005

(65) Prior Publication Data

US 2007/0031986 A1    Feb. 8, 2007

(30) Foreign Application Priority Data

Aug. 4, 2005    (JP) .............................. 2005-226865

(51) Int. Cl.
*H01L 21/00*    (2006.01)
(52) U.S. Cl. ............................. 438/48; 438/57; 438/69; 438/71; 257/E25.004; 257/E25.007
(58) Field of Classification Search .................. 438/57, 438/69, 71, 48; 257/E25.004, 25.007
See application file for complete search history.

(56) References Cited

U.S. PATENT DOCUMENTS

| 4,137,123 A | 1/1979 | Bailey et al. |
| 4,322,571 A | 3/1982 | Stanbery |
| 2002/0098700 A1 | 7/2002 | Alwan et al. |
| 2004/0063326 A1* | 4/2004 | Szlufcik et al. ............. 438/695 |
| 2005/0126627 A1 | 6/2005 | Hayashida |

FOREIGN PATENT DOCUMENTS

| DE | 100 32 279 | 1/2002 |
| JP | 05-326990 A | 12/1993 |
| JP | 11-214722 | 8/1999 |

OTHER PUBLICATIONS

"Silicon Etching Pastes for Edge Isolation," product description for SolarEtch Si, 2004, 3 pages, Merck KGaA, D-64271 Darmstadt, Germany.
German Office Action, with English-Language Translation, dated Nov. 26, 2009.

* cited by examiner

*Primary Examiner*—Davienne Monbleau
*Assistant Examiner*—Matthew Reames
(74) *Attorney, Agent, or Firm*—Buchanan Ingersoll & Rooney PC

(57) ABSTRACT

A method of manufacturing a solar cell includes forming a diffusion layer on a crystal-type silicon substrate. The diffusion layer has a conductivity opposite to that of the substrate. Furthermore, the method includes etching and removing a part of the diffusion layer by using sodium silicate, and forming a first electrode that makes an electric contact with the diffusion layer and forming a second electrode that makes an electric contact with the substrate.

29 Claims, 5 Drawing Sheets

CONVENTIONAL ART

US 7,741,139 B2

SOLAR CELL MANUFACTURING METHOD

BACKGROUND OF THE INVENTION

1. Field of the Invention

The present invention relates to a method of manufacturing a silicon solar cell, and, more particularly to a method of electrically insulating electrodes of the solar cell.

2. Description of the Related Art

In a silicon solar cell, light is converted into electricity by separating and collecting carriers (electrons and holes) with the aid of diffusion potential of a pn junction of the solar cell. Carriers are generated when light is irradiated to the pn junction.

Silicon solar cells can be of two types: front-surface-junction solar cells and back-surface-junction solar cell. In a front-surface-junction solar cell, as shown in FIG. 3, electrodes are formed on a front surface (light receiving surface) and a back surface. This solar cell has an n-type diffusion layer 2 on a front surface of a p-type silicon substrate 1, and a pn junction 3 in the boundary of the p-type silicon substrate 1 and the n-type diffusion layer 2. A first electrode 5 makes an electric contact with the n-type diffusion layer 2 and a second electrode 6 makes an electric contact with the p-type silicon substrate 1. An anti-reflection coating 4 is formed on the light receiving surface of the solar cell.

In a back-surface-junction solar cell, as shown in FIG. 4, electrodes are formed only on the surface opposite to the light receiving surface. This solar cell has the n-type diffusion layer 2 on the back surface and the edges of the p-type silicon substrate 1. The pn junction 3 is formed in the boundary of the p-type silicon substrate 1 and the n-type diffusion layer 2. A first electrode 5 and a second electrode 6 are formed on the back surface. The first electrode 5 makes an electric contact with the n-type diffusion layer 2 and the second electrode 6 makes an electric contact with the p-type silicon substrate 1. An anti-reflection coating 4 is formed on the light receiving surface.

The solar cells can be formed by various methods. Diffusion layer formation method, for example, is commonly used. Gas is used as a diffusion source in the diffusion layer formation method which makes this method cost effective and suitable for mass production. In the diffusion layer formation method, although a diffusion layer can be advantageously formed on the entire surface of the substrate, a short circuit is disadvantageously formed between the first electrode and the second electrode via the diffusion layer. FIG. 5 is a schematic of the short circuit.

Parallel resistance of the solar cell decreases due to formation of the short circuit, thereby reducing Fill Factor (FF) that directly contributes to conversion efficiency of the solar cell. Therefore, as described in Japanese Patent Laid-Open Publication No. H5-326990 (see Page 3, FIG. 1), a part of the diffusion layer needs to be removed to electrically insulate the first electrode and the second electrode from each other. In a method employed for a front-surface-junction crystalline silicon solar cell, silicon wafers are stacked and the diffusion layer on the edges is removed by means of plasma.

Thin silicon wafers are generally used to reduce cost. However, thin wafers are fragile and they can break easily. Moreover, when a structure is employed in which a plurality of silicon wafers are stacked, each silicon wafer needs to be handled separately.

Solar cells can be formed using etching methods (mask etching method). The etching methods include wet etching and dry etching. Wet etching includes etching using an acid or an alkali. Dry etching includes etching using Reactive Ion Etching (RIE). However, the etching methods include a lot of steps such as application of etching resist, drying, removal of etching resist, washing, etc. so that the etching methods are costlier.

SUMMARY OF THE INVENTION

It is an object of the present invention to at least solve the problems in the conventional technology.

According to an aspect of the present invention, a method of manufacturing a solar cell includes forming a diffusion layer on a crystal-type silicon substrate, wherein the diffusion layer has a conductivity opposite to that of the substrate, etching and removing a part of the diffusion layer by using sodium silicate, and forming a first electrode that makes an electric contact with the diffusion layer and forming a second electrode that makes an electric contact with the substrate.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Exemplary embodiments of the present invention will be described below with reference to accompanying drawings. The present invention is not limited to these embodiments.

Figure 1A:
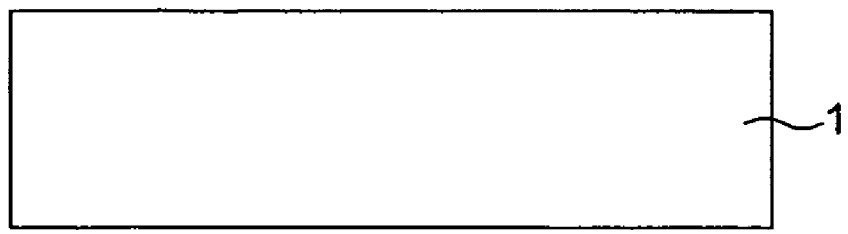
FIG. 1A through FIG. 1E depict a method of manufacturing of a solar cell according to a first embodiment of the present invention.
Figure 1B:
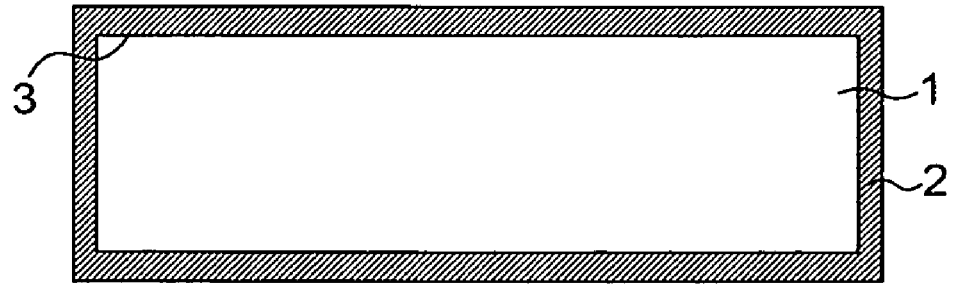
Figure 1C:
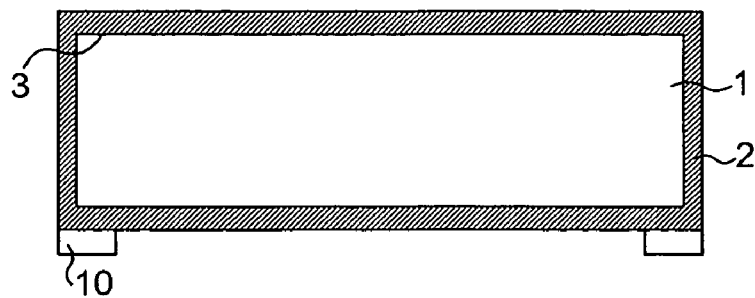
Figure 1D:
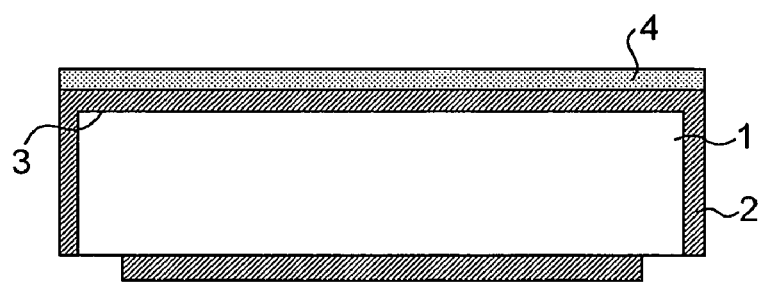
Figure 1E:
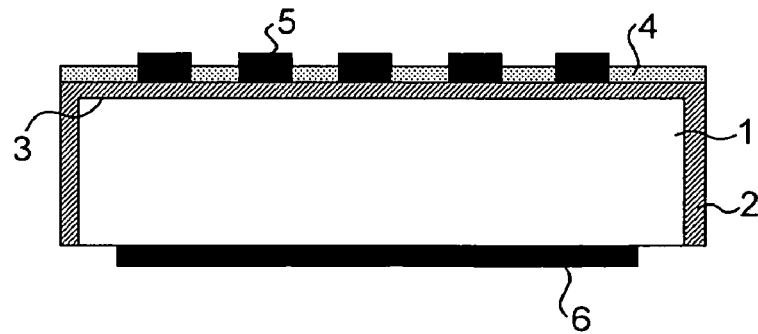

FIG. 1A through FIG. 1E depict a method of manufacturing a front-surface-junction solar cell according to a first embodiment of the present invention. In the final structure of the front-surface-junction solar cell, as shown in FIG. 1E, an n-type diffusion layer 2 is formed on a front surface and edges of a p-type silicon substrate 1. A pn junction 3 is formed in the boundary of the p-type silicon substrate 1 and the n-type diffusion layer 2. A first electrode 5 makes an electric contact with the n-type diffusion layer 2 and a second electrode 6 makes an electric contact with the p-type silicon substrate 1. An anti-reflection coating 4 is formed on a light receiving surface of the front-surface-junction solar cell.

The method of manufacturing is explained in detail next. A wafer of multicrystalline silicon is prepared as the p-type silicon substrate 1 shown in FIG. 1A. The p-type silicon substrate 1 is, for example, 200 μm to 400 μm thick, about 150 mm wide, and 150 mm long. The p-type silicon substrate 1 is treated with a mixed solution of sodium hydroxide (NaOH) and isopropyl alcohol (IPA) to remove layers that are damaged during the slice processing, and to form minute asperities on the wafer surface. The minute asperities are formed so that light is effectively absorbed.

The p-type silicon substrate 1 is then inserted in a diffusion furnace, and phosphorus oxychloride ($POCl_3$) is passed in the diffusion furnace to form the n-type diffusion layer 2 as shown in FIG. 1B. The n-type diffusion layer 2 has a sheet resistance of 55Ω/sq, for example. The n-type diffusion layer 2 is formed on the entire surface, i.e., front surface, back surface, and edges, of the p-type silicon substrate 1.

After removing phosphorus glass on the outside of the diffusion layer by etching, sodium silicate 10 is applied, as shown in FIG. 1C, on the periphery of the back surface of the p-type silicon substrate 1 with the aid of a dispenser. An appropriate amount of water is added to the sodium silicate 10 to maintain a viscosity of more than 4 Pa·s, thereby enabling to preserve the formed structure even after application of the sodium silicate 10.

Once the sodium silicate 10 dries, silicon is etched from the part of the p-type silicon substrate 1 where the sodium silicate 10 is applied, including the n-type diffusion layer 2. Heat is generated during the etching process and the heat further accelerates the etching process. Water evaporates during the etching and the etching stops when water is completely evaporated. Next, the sodium silicate 10 is removed by washing with water, and the anti-reflection coating 4 including a silicon nitride film is deposited on the front surface of the p-type silicon substrate 1 by using plasma Chemical Vapor Deposition (CVD) method.

Then, as shown in FIG. 1E, the second electrode 6 is screen printed by means of aluminum paste over the n-type diffusion layer 2 that is remaining on the back surface of the p-type silicon substrate 1. After the aluminum paste dries, a back surface electrode (not shown) for interconnection and the first electrode 5 are screen printed by means of silver paste and calcined in air. The aluminum paste is diffused on the back surface of the p-type silicon substrate 1 during calcination to form a Back Surface Field (BSF) layer that contributes to the enhancement of energy conversion efficiency.

It is not necessary to apply the sodium silicate 10 before depositing the anti-reflection coating 4. In other words, sodium silicate 10 can also be applied after depositing the anti-reflection coating 4 or after formation of the electrodes.

In the first embodiment, a part of the n-type diffusion layer is etched and removed by means of sodium silicate. Thus, the need to stack silicon wafers is eliminated, thereby reducing the load on the silicon wafers, preventing cracking and enabling reliable solar cell manufacturing. Further, sodium silicate of controlled viscosity is applied by means of the dispenser, and therefore, a mask for etching resist and screen printing is not needed.

Moreover, because the n-type diffusion layer only in the periphery of the back surface of the p-type silicon substrate is etched, the n-type diffusion layer on the edges of the p-type silicon substrate can continue contributing to generation of electricity, thereby enabling to increase the output current.

Figure 2A:
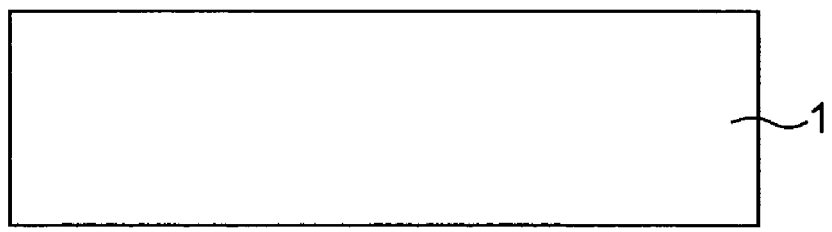
FIG. 2A through FIG. 2E depict a method of manufacturing of a solar cell according to a second embodiment of the present invention.
Figure 2B:
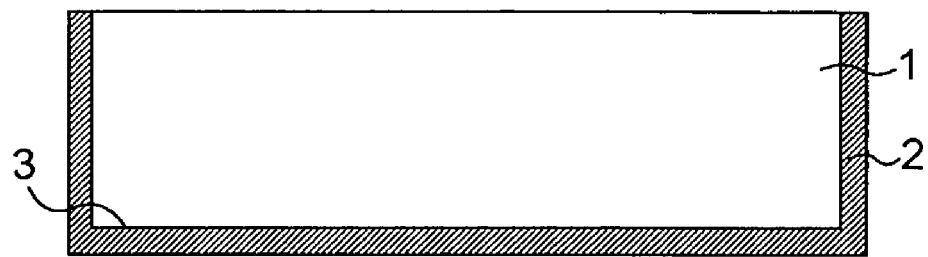
Figure 2C:
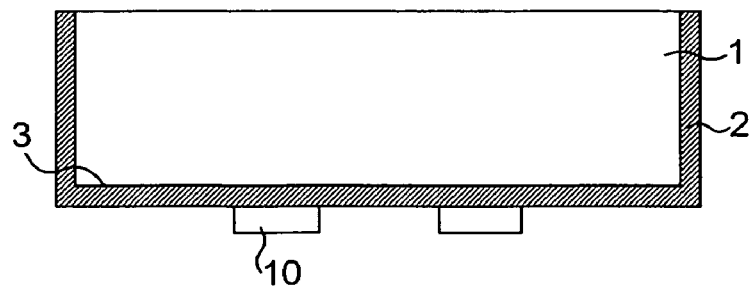
Figure 2D:
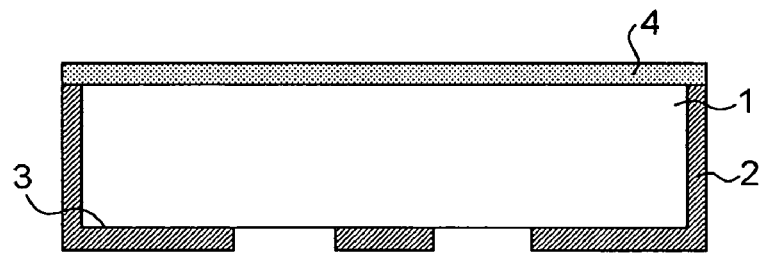
Figure 2E:
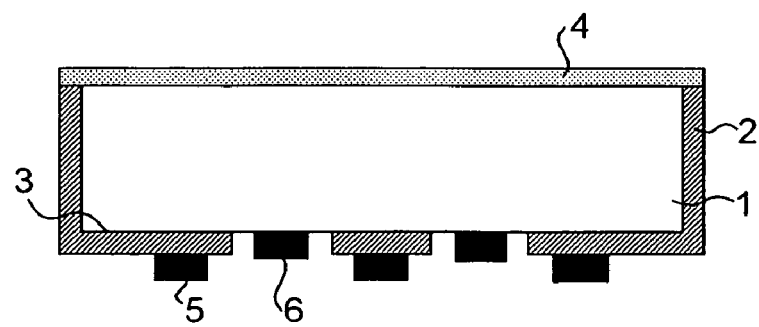
Figure 3:
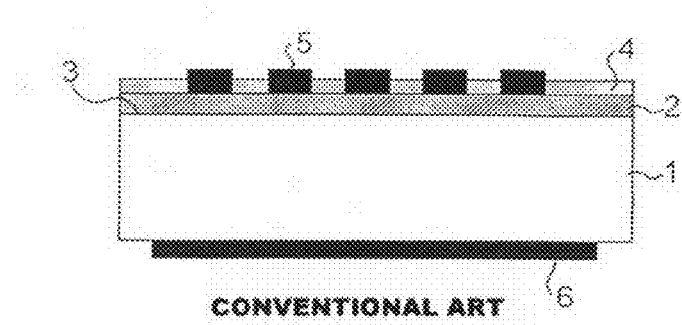
FIG. 3 is a drawing of a structure of a conventional front-surface-junction solar cell.
Figure 4:
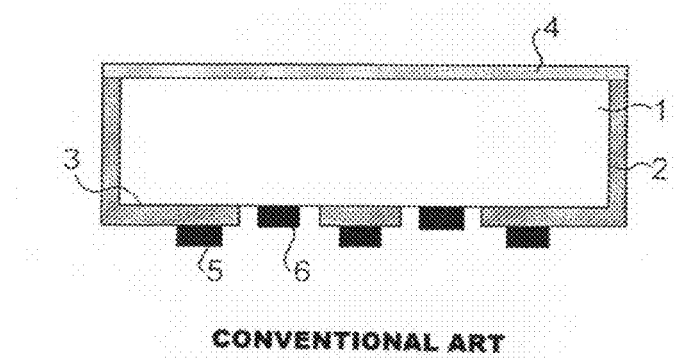
FIG. 4 is a drawing of a structure of a conventional back-surface-junction solar cell.
Figure 5:
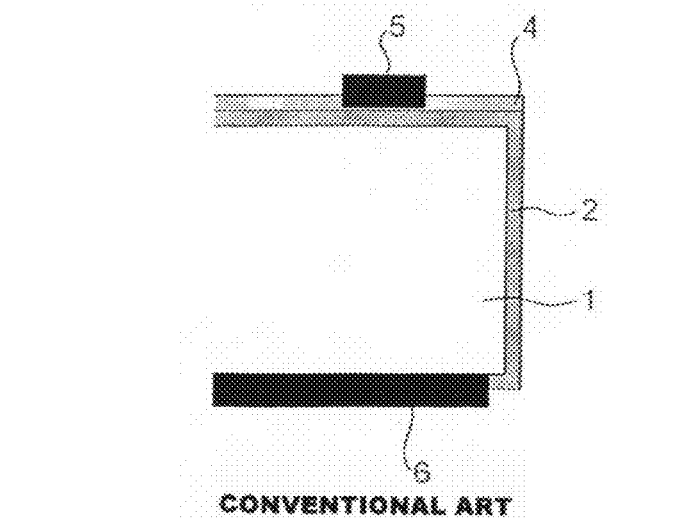
FIG. 5 is a drawing of drawbacks during a method of manufacturing a conventional solar cell.

FIG. 2A through FIG. 2E depict a method of manufacturing a back-surface-junction solar cell according to a second embodiment of the present invention. In the final structure of the back-surface-junction solar cell, as shown in FIG. 2E, the n-type diffusion layer 2 is formed on the back surface and the edges of the p-type silicon substrate 1. The pn junction 3 is formed in the boundary of the p-type silicon substrate 1 and the n-type diffusion layer 2. The first electrode 5 that makes an electric contact with the n-type diffusion layer 2 and the second electrode 6 that makes an electric contact with the p-type silicon substrate 1 are formed on the back surface of the back-surface-junction solar cell. The anti-reflection coating 4 is formed on the light receiving surface of the back-surface-junction solar cell.

The method of manufacturing is explained in detail next. A wafer of multicrystalline silicon similar to the wafer used in the first embodiment is prepared as the p-type silicon substrate 1 shown in FIG. 2A. A process to remove layers damaged during the slice processing and a process to form minute asperities on the wafer surface are similar to the respective processes in the first embodiment.

The p-type silicon substrate 1 is then inserted in the diffusion furnace, and phosphorus oxychloride ($POCl_3$) is passed in the diffusion furnace to form the n-type diffusion layer 2 as shown in FIG. 2B. The n-type diffusion layer 2 has a sheet resistance of 55Ω/sq, for example. During the aforementioned process, the front surface of the p-type silicon substrate 1 is masked so that the n-type diffusion layer 2 is formed only on the back surface and the edges of the p-type silicon substrate 1.

After removing the phosphorus glass on the outside of the diffusion layer by etching, the sodium silicate 10 is applied, as shown in FIG. 2C, in a plane pattern at the locations where the second electrode 6 is to be connected on the back surface of the p-type silicon substrate 1 by means of screen printing. An appropriate amount of water is added to the sodium silicate 10 to maintain a viscosity of more than 4 Pa·s and less than 7 Pa·s, thereby enabling to reduce the unevenness of thickness of the sodium silicate 10, ensure accuracy of the location of the plane pattern, and preserve the formed structure even after application of the sodium silicate 10.

Once the sodium silicate 10 dries, it is removed by washing with water in a sequence similar to that in the first embodiment. The anti-reflection coating 4 including a silicon nitride film is deposited on the front surface of the p-type silicon substrate 1 by using the plasma CVD method in a sequence similar to that in the first embodiment.

Then, as shown in FIG. 2E, the second electrode 6 is screen printed by means of the aluminum paste in the area where the n-type diffusion layer 2 is removed with the aid of the sodium silicate 10. After the aluminum paste dries, the first electrode 5 is screen printed by means of the silver paste and calcined in air. During the calcination, the BSF layer is formed beneath the second electrode 6 as explained in the first embodiment.

It is not necessary to apply the sodium silicate 10 before depositing the anti-reflection coating 4. In other words, the sodium silicate 10 can also be applied after depositing the anti-reflection coating 4.

In the second embodiment, a part of the n-type diffusion layer is etched and removed by means of sodium silicate. Thus, a reliable solar cell manufacturing method that reduces the load on the silicon wafers can be applied to the back-surface-junction solar cell. Moreover, the etching resist is not needed during etching and removing a part of the n-type diffusion layer, thereby simplifying the etching process.

According to the present invention, a part of a diffusion layer that has conductivity opposite to a substrate is etched and removed by means of sodium silicate, thereby removing the need to stack silicon wafers, reducing the load on the silicon wafers, preventing occurrence of cracking, and enabling reliable solar cell manufacturing. Moreover, etching resist during removal of the diffusion layer is unnecessary. As a result, an increase in the number of processes during the etching process is prevented, so that manufacturing costs can be suppressed.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A method of manufacturing a solar cell, comprising:

forming a diffusion layer on a crystal-type silicon substrate to cover entirely surfaces of the substrate, the surfaces including a front surface, a back surface and edges of the substrate, wherein the diffusion layer has a conductivity opposite to that of the substrate;

applying sodium silicate to a part of the diffusion layer that is located along a periphery of the back surface;

etching and removing the part of the diffusion layer on which the sodium silicate is applied, while leaving the diffusion layer on the edges;

removing the sodium silicate after the etching is performed;

depositing an anti-reflection coating on the front surface; and forming a first electrode that makes an electric contact with the diffusion layer and forming a second electrode that makes an electric contact with the substrate, after depositing the anti-reflection coating.

2. The method according to claim 1, wherein the sodium silicate is applied on the part of the diffusion layer with a dispenser.

3. The method according to claim 1, wherein the sodium silicate is applied by screen printing onto the part of the diffusion layer, which is formed on the back surface of the substrate.

4. The method according to claim 1, wherein the first electrode is electrically isolated from the second electrode.

5. The method according to claim 1, wherein the forming of the diffusion layer includes forming the diffusion layer on at least one surface of the substrate in a furnace.

6. The method according to claim 1, wherein the sodium silicate has a viscosity within a range of 4 Pas to 7 Pas.

7. The method according to claim 6, wherein a surface of the substrate on which the part of the diffusion layer is formed is preserved when the part of the diffusion layer is etched and removed, due to the viscosity of the sodium silicate.

8. The method according to claim 1, wherein a surface of the substrate on which the part of the diffusion layer is formed is preserved when the part of the diffusion layer is etched and removed.

9. A method of manufacturing a solar cell, comprising:
forming a diffusion layer on a crystal-type silicon substrate, the diffusion layer having a conductivity opposite to that of the substrate;
liquefying an etchant with an aqueous solution to a predetermined viscosity;
applying the liquefied etchant to a part of the diffusion layer that is located along a periphery of the substrate;
drying the applied etchant to evaporate the aqueous solution therefrom, to etch and remove the part of the diffusion layer on which the liquefied etchant was applied; and
forming a first electrode that makes an electric contact with the diffusion layer and forming a second electrode that makes an electric contact with the substrate.

10. The method according to claim 9, wherein the etchant is sodium silicate.

11. The method according to claim 10, wherein the predetermined viscosity of the sodium silicate is in the range of 4 Pas to 7 Pas.

12. The method according to claim 10, wherein a surface of the substrate on which the part of the diffusion layer is formed is preserved when the part of the diffusion layer is etched and removed, due to the viscosity of the sodium silicate.

13. The method according to claim 9, wherein:
the diffusion layer is formed to cover surfaces of the substrate, the surfaces including at least one of a front surface and a back surface of the substrate, and edges of the substrate between the front and back surfaces; and
the diffusion layer is left on the edges of the substrate while the part of the diffusion layer is etched and removed.

14. The method according to claim 13, wherein the part of the diffusion layer to which the etchant is applied is located along a periphery of the back surface of the substrate.

15. The method according to claim 13, wherein the part of the diffusion layer on which the liquefied etchant was applied is etched and removed while the diffusion layer is left on the edges of the substrate.

16. The method according to claim 13, wherein the second electrode is formed on the back surface of the substrate.

17. The method according to claim 16, wherein the first electrode is formed on a part of the diffusion layer formed on the back surface of the substrate, so as to be electrically isolated from the second electrode.

18. The method according to claim 16, wherein the first electrode is formed on a part of the diffusion layer formed on the front surface of the substrate, so as to be electrically isolated from the second electrode.

19. The method according to claim 16, further comprising:
depositing an anti-reflection coating on the front surface, wherein the first electrode and the second electrode are formed after the anti-reflection coating is deposited.

20. A method of manufacturing a solar cell, comprising:
forming a diffusion layer on a crystal-type silicon substrate to cover entirely surfaces of the substrate, the surfaces including a back surface and edges of the substrate, wherein the diffusion layer has a conductivity opposite to that of the substrate;
applying sodium silicate to a part of the diffusion layer that is located along a periphery of the back surface;
etching and removing the part of the diffusion layer on which the sodium silicate is applied, while leaving the diffusion layer on the edges; and
forming a first electrode that makes an electric contact with the diffusion layer and forming a second electrode that makes an electric contact with the substrate.

21. The method according to claim 20, wherein the sodium silicate is applied on the part of the diffusion layer with a dispenser.

22. The method according to claim 20, wherein the sodium silicate is applied by screen printing onto the part of the diffusion layer, which is formed on the back surface of the substrate.

23. The method according to claim 20, wherein the first electrode is electrically isolated from the second electrode.

24. The method according to claim 20, wherein the forming of the diffusion layer includes forming the diffusion layer on at least one surface of the substrate in a furnace.

25. The method according to claim 20, wherein the sodium silicate has a viscosity within a range of 4 Pas to 7 Pas.

26. The method according to claim 25, wherein a surface of the substrate on which the part of the diffusion layer is formed is preserved when the part of the diffusion layer is etched and removed, due to the viscosity of the sodium silicate.

27. The method according to claim 20, wherein a surface of the substrate on which the part of the diffusion layer is formed is preserved when the part of the diffusion layer is etched and removed.

28. The method according to claim 20, wherein:
the applying of the sodium silicate comprises liquefying the sodium silicate with an aqueous solution to a predetermined viscosity, and applying the liquefied sodium silicate to the part of the diffusion layer; and the etching and removing of the part of the diffusion layer comprises drying the liquefied sodium silicate applied to the part of the diffusion layer to evaporate the aqueous solution therefrom and etch and remove the part of the diffusion layer on which the liquefied sodium silicate was applied.

29. The method according to claim 20, further comprising:

depositing an anti-reflection coating on a front surface of the substrate opposite to the back surface of the substrate, wherein the first electrode and the second electrode are formed after the anti-reflection coating is deposited.

* * * * *